(12) United States Patent
Hu et al.

(10) Patent No.: US 10,453,509 B2
(45) Date of Patent: *Oct. 22, 2019

(54) MAGNETIC EXCHANGE COUPLED MTJ FREE LAYER WITH DOUBLE TUNNEL BARRIERS HAVING LOW SWITCHING CURRENT AND HIGH DATA RETENTION

(71) Applicant: International Business Machines Corporation, Armonk, NY (US)

(72) Inventors: Guohan Hu, Yorktown Heights, NY (US); Daniel C. Worledge, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/802,827

(22) Filed: Nov. 3, 2017

(65) Prior Publication Data

US 2018/0358067 A1 Dec. 13, 2018

Related U.S. Application Data

(63) Continuation of application No. 15/616,283, filed on Jun. 7, 2017, now Pat. No. 10,332,576.

(51) Int. Cl.
*G11C 11/16* (2006.01)
*H01L 43/10* (2006.01)
(Continued)

(52) U.S. Cl.
CPC ........ *G11C 11/161* (2013.01); *G11C 11/1675* (2013.01); *H01L 27/228* (2013.01);
(Continued)

(58) Field of Classification Search
CPC . G11C 11/161; G11C 11/1675; H01L 27/228; H01L 43/02; H01L 43/08; H01L 43/10; H01L 43/12
(Continued)

(56) References Cited

U.S. PATENT DOCUMENTS

| 5,930,164 A | * | 7/1999 | Zhu | G11C 11/5607 |
| | | | | 257/E27.005 |
| 7,009,877 B1 | * | 3/2006 | Huai | G11C 11/16 |
| | | | | 257/E27.005 |

(Continued)

OTHER PUBLICATIONS

Hu et al., "Magnetic Exchange Coupled MTJ Free Layer Having Low Switching Current and High Data Retention," U.S. Appl. No. 15/616,297, filed Jun. 7, 2017.
(Continued)

*Primary Examiner* — Sung Il Cho
(74) *Attorney, Agent, or Firm* — Cantor Colburn LLP; Vazken Alexanian

(57) ABSTRACT

Embodiments of the invention are directed to a magnetic tunnel junction (MTJ) storage element that includes a reference layer, a tunnel barrier and a free layer on an opposite side of the tunnel barrier layer from the reference layer. The reference layer has a fixed magnetization direction. The free layer includes a first region, a second region and a third region. The third region is formed from a third material that is configured to magnetically couple the first region and the second region. The first region is formed from a first material having a first predetermined magnetic moment, and the second region is formed from a second material having a second predetermined magnetic moment. The first predetermined magnetic moment is lower that the second predetermined magnetic moment.

4 Claims, 6 Drawing Sheets

(51) Int. Cl.
*H01L 27/22* (2006.01)
*H01L 43/12* (2006.01)
*H01L 43/02* (2006.01)
*H01L 43/08* (2006.01)

(52) U.S. Cl.
CPC .............. *H01L 43/02* (2013.01); *H01L 43/08* (2013.01); *H01L 43/10* (2013.01); *H01L 43/12* (2013.01)

(58) Field of Classification Search
USPC ........................................................ 365/158
See application file for complete search history.

(56) References Cited

U.S. PATENT DOCUMENTS

| | | | | |
|---|---|---|---|---|
| 8,018,011 | B2* | 9/2011 | Ranjan | G11C 11/5607 257/421 |
| 8,183,652 | B2* | 5/2012 | Ranjan | B82Y 10/00 257/421 |
| 8,362,580 | B2* | 1/2013 | Chen | H01L 27/228 257/421 |
| 8,482,968 | B2* | 7/2013 | Worledge | H01L 43/08 365/158 |
| 8,969,984 | B2* | 3/2015 | Zhu | H01L 43/08 257/421 |
| 9,166,143 | B1* | 10/2015 | Gan | H01L 43/08 |
| 9,184,375 | B1* | 11/2015 | Tang | H01L 27/222 |
| 9,318,695 | B2* | 4/2016 | Oh | H01L 43/08 |
| 9,825,216 | B2* | 11/2017 | Park | H01L 43/02 |
| 2004/0047086 | A1* | 3/2004 | Wang | B82Y 10/00 360/324.12 |
| 2004/0256218 | A1* | 12/2004 | Glass | C23C 14/165 428/692.1 |
| 2005/0189574 | A1* | 9/2005 | Nguyen | B82Y 25/00 257/295 |
| 2005/0201022 | A1* | 9/2005 | Horng | B82Y 25/00 360/324.11 |
| 2005/0259463 | A1* | 11/2005 | Lim | B82Y 25/00 365/158 |
| 2006/0152969 | A1* | 7/2006 | Trouilloud | G11C 11/16 365/171 |
| 2006/0154381 | A1* | 7/2006 | Gaidis | G11C 11/16 438/3 |
| 2007/0297222 | A1* | 12/2007 | Leuschner | G11C 11/15 365/171 |
| 2009/0097170 | A1* | 4/2009 | Sato | B82Y 10/00 360/324.12 |
| 2009/0129143 | A1* | 5/2009 | Guo | H01L 27/226 365/158 |
| 2009/0262638 | A1* | 10/2009 | Xi | B82Y 25/00 369/126 |
| 2010/0046288 | A1* | 2/2010 | Honjou | H01L 43/08 365/171 |
| 2010/0109109 | A1* | 5/2010 | Chen | G11C 11/161 257/421 |
| 2011/0133298 | A1* | 6/2011 | Chen | H01L 27/228 257/421 |
| 2011/0297909 | A1* | 12/2011 | Fukami | G11C 11/16 257/1 |
| 2012/0120719 | A1* | 5/2012 | Worledge | H01L 43/08 365/158 |
| 2012/0127603 | A1* | 5/2012 | Gao | B82Y 10/00 360/75 |
| 2012/0135275 | A1* | 5/2012 | Kariyada | G11C 11/161 428/828.1 |
| 2013/0154035 | A1* | 6/2013 | Krounbi | H01L 43/08 257/421 |
| 2014/0151829 | A1* | 6/2014 | Watts | B82Y 25/00 257/421 |
| 2014/0159175 | A1* | 6/2014 | Lee | G11C 11/16 257/421 |
| 2014/0349413 | A1* | 11/2014 | Chung | H01L 43/12 438/3 |
| 2015/0091110 | A1* | 4/2015 | Kuo | H01L 43/08 257/421 |
| 2015/0332748 | A1* | 11/2015 | Wang | G11C 11/165 365/158 |
| 2017/0092848 | A1* | 3/2017 | Jang | H01L 43/08 |
| 2017/0309813 | A1* | 10/2017 | Naik | H01F 10/16 |

OTHER PUBLICATIONS

Hu et al., "Magnetic Exchange Coupled MTJ Free Layer Having Low Switching Current and High Data Retention," U.S. Appl. No. 15/802,838, filed Nov. 3, 2017.
Hu et al., "Magnetic Exchange Coupled MTJ Free Layer With Double Tunnel Barriers Having Low Switching Current and High Data Retention," U.S. Appl. No. 15/616,283, filed Jun. 7, 2017.
List of IBM Patents or Patent Applications Treated As Related; Date Filed: Nov. 3, 2017, 2 pages.

* cited by examiner

MAGNETIC EXCHANGE COUPLED MTJ FREE LAYER WITH DOUBLE TUNNEL BARRIERS HAVING LOW SWITCHING CURRENT AND HIGH DATA RETENTION

DOMESTIC PRIORITY

This application is a continuation of U.S. application Ser. No. 15/616,283, filed Jun. 7, 2017, the contents of which are incorporated by reference herein in its entirety.

BACKGROUND

The present invention relates generally to electronic memory, and more specifically to spin transfer torque (STT) magnetic tunnel junction (MTJ) storage elements having a magnetic exchange coupled composite free layer and double tunnel barriers configured to minimize the magnitude of a fast switching current (e.g., a write pulse width ≤10 ns) while providing high data retention (e.g., ≥10 years).

Electronic memory can be classified as volatile or non-volatile. Volatile memory retains its stored data only when power is supplied to the memory, but non-volatile memory retains its stored data without constant power. Volatile random access memory (RAM) provides fast read/write speeds and easy re-write capability. However, when system power is switched off, any information not copied from volatile RAM to a hard drive is lost. Although non-volatile memory does not require constant power to retain its stored data, it in general has lower read/write speeds and a relatively limited lifetime in comparison to volatile memory.

Magnetoresistive random access memory (MRAM) is a non-volatile memory that combines a magnetic device with standard silicon-based microelectronics to achieve the combined attributes of non-volatility, high-speed read/write operations, high read/write endurance and data retention. The term "magnetoresistance" describes the effect whereby a change to certain magnetic states of the MTJ storage element (or "bit") results in a change to the MTJ resistance, hence the name "Magnetoresistive" RAM. Data is stored in MRAM as magnetic states or characteristics (e.g., magnetization direction, magnetic polarity, magnetic moment, etc.) instead of electric charges. In a typical configuration, each MRAM cell includes a transistor, a MTJ device for data storage, a bit line and a word line. In general, the MTJ's electrical resistance will be high or low based on the relative magnetic states of certain MTJ layers. Data is written to the MTJ by applying certain magnetic fields or charge currents to switch the magnetic states of certain MTJ layers. Data is read by detecting the resistance of the MTJ. Using a magnetic state/characteristic for storage has two main benefits. First, unlike electric charge, magnetic state does not leak away with time, so the stored data remains even when system power is turned off. Second, switching magnetic states has no known wear-out mechanism.

STT is a phenomenon that can be leveraged in MTJ-based storage elements to assist in switching the storage element from one storage state (e.g., "0" or "1") to another storage state (e.g., "1" or "0"). For example, STT-MRAM 100 shown in FIG. 1 uses electrons that have been spin-polarized to switch the magnetic state (i.e., the magnetization direction 110) of a free layer 108 of MTJ 102. The MTJ 102 is configured to include a reference/fixed magnetic layer 104, a thin dielectric tunnel barrier 106 and a free magnetic layer 108. The MTJ 102 has a low resistance when the magnetization direction 110 of its free layer 108 is parallel to the magnetization direction 112 of its fixed layer 104. Conversely, the MTJ 102 has a high resistance when its free layer 108 has a magnetization direction 110 that is oriented anti-parallel to the magnetization direction 112 of its fixed layer 104. STT-MRAM 100 includes the multi-layered MTJ 102 in series with the FET 120, which is gated by a word line (WL) 124. The BL 126 and a source line (SL) 128 can, depending on the design, run parallel to each other. The BL 126 is coupled to the MTJ 102, and the SL 128 is coupled to the FET 120. The MTJ 102 (which is one of multiple MTJ storage elements along the BL 126) is selected by turning on its WL 124.

The MTJ 102 can be read by activating its associated word line transistor (e.g., field effect transistor (FET) 120), which switches current from a bit line (BL) 126 through the MTJ 102. The MTJ resistance can be determined from the sensed current, which is itself based on the polarity of the magnetization direction 110 of the free layer 108. Conventionally, if the magnetization directions 112, 110 of the fixed layer 104 and the free layer 108 have the same polarities, the resistance is low and a "0" is read. If the magnetization directions 112, 110 of the fixed layer 104 and the free layer 108 have opposite polarities, the resistance is higher and a "1" is read.

When a voltage (e.g., 500 mV) is forced across the MTJ 102 from the BL 126 to the SL 128, current flows through the selected cell's MTJ 102 to write it into a particular state, which is determined by the polarity of the applied voltage (BL high vs. SL high). During the write operation, spin-polarized electrons generated in the reference layer 104 tunnel through the tunnel layer 106 and exert a torque on the free layer 108, which can switch the magnetization direction 110 of the free layer 108. Thus, the amount of current required to write to a STT-MRAM MTJ depends on how efficiently spin polarization is generated in the MTJ. Additionally, STT-MRAM designs that keep write currents small (e.g., $I_c$<25 micro-ampere) are important to improving STT-MRAM scalability. This is because a larger switching current would require a larger transistor (e.g., FET 120), which would inhibit the ability to scale up STT-MRAM density.

However, in order to achieve fast switching (e.g., a write pulse width 10 ns) in STT MRAM devices, a large current is needed. More specifically, in a fast switching regime, a so-called overdrive current, which is the difference between the switching current $I_c$ at a certain pulse width and the critical current $I_{c0}$, is inversely proportionally to the write pulse, as shown in Equation (1).

$$\eta \frac{I_c - I_{c0}}{e} t_p \propto \frac{m}{\mu_B} \qquad \text{Equation (1)}$$

In Equation (1), $I_c$-$I_{c0}$ is the overdrive current, $\eta$ is the spin polarization of the magnetic materials, $t_p$ is the pulse width, m is the total moment of the free layer material, and $\mu_B$ is the Bohr magneton, which is a constant. Equation (1) suggests that to minimize the switching current at a certain pulse width, it is necessary to reduce the free layer moment (m). Providing a low moment free layer is also advantageous for improving the MTJ's deep bit write error rate (WER) performance.

However, simple low moment free layers suffer from low activation energy ($E_b$), which results in poor retention. In general, the activation energy is the amount of energy required to flip the MTJ free layer's magnetic state. In order to retain data that has been written to the MTJ free layer, the activation energy must be sufficiently high to prevent random energy sources (e.g., heat) in the MTJ's operating environment from unintentionally applying enough energy to flip the MTJ free layer. Accordingly, in known STT-MRAM operating in a fast switching regime, minimizing the switching current through a low moment free layer has the undesirable result of lowering activation energy ($E_b$) and data retention (e.g., ≤10 years).

SUMMARY

Embodiments of the invention are directed to magnetic tunnel junction (MTJ) storage elements. A non-limiting example of the MTJ includes a first reference layer having a first fixed magnetization direction, a first tunnel barrier layer, a free layer on an opposite side of the first tunnel barrier layer from the first reference layer, a second tunnel barrier on an opposite side of the free layer from the first tunnel barrier, and a second reference layer having a second fixed magnetization direction. The second reference layer is on an opposite side of the second tunnel barrier from the free layer. The free layer includes a first region, a second region and a third region. The first region includes a first material configured to include a first switchable magnetization direction. The second region includes a second material configured to include a second switchable magnetization direction. The first spacer material is between the first region and the second region, and the first spacer material is configured to provide magnetic exchange coupling between the first region and the second region. Advantages of the above-described embodiments of the invention include, but are not limited to, providing the ability to use the first region to assist the process of switching the second region magnetization direction using magnetic exchange coupling provided by the third region, use the first reference layer to begin the process of switching the first region magnetization direction through STT, and use the second reference layer to assist the process of switching the second region magnetization direction through STT.

Embodiments of the invention are directed to MTJ storage elements. A non-limiting example of the MTJ includes a first reference layer having a first fixed magnetization direction, a first tunnel barrier layer, a free layer on an opposite side of the first tunnel barrier layer from the first reference layer, a second tunnel barrier on an opposite side of the free layer from the first tunnel barrier, and a second reference layer having a second fixed magnetization direction, where the second reference layer is on an opposite side of the second tunnel barrier from the free layer. The free layer includes a first region, a second region, a third region, a first spacer material, and a second spacer material. The first region includes a first material configured to include a first switchable magnetization direction. The second region includes a second material configured to include a second switchable magnetization direction. The third region includes a third material configured to include a third switchable magnetization direction. The first spacer material is between the first region and the second region, and the first spacer material is configured to provide magnetic exchange coupling between the first region and the second region. The second spacer material is between the second region and the third region, and the second spacer material is configured to provide magnetic exchange coupling between the second region and the third region. Advantages of the above-described embodiments of the invention include, but are not limited to, providing the ability to use the first region to assist the process of switching the second region magnetization direction using magnetic exchange coupling provided by the first spacer region, use the third region to assist the process of switching the second region magnetization direction using magnetic exchange coupling provided by the second spacer region, use the first reference layer to begin the process of switching the first region magnetization direction through STT, and use the second reference layer to assist the process of switching the second region magnetization direction through STT.

Embodiments of the invention are directed to MTJ storage elements. A non-limiting example of the method includes forming a first reference layer having a first fixed magnetization direction, forming a first tunnel barrier layer, forming a composite free layer on an opposite side of the first tunnel barrier layer from the first reference layer, forming a second tunnel barrier on an opposite side of the free layer from the first tunnel barrier, and forming a second reference layer having a second fixed magnetization direction. The second reference layer is on an opposite side of the second tunnel barrier from the free layer. Forming the composite free layer includes forming a first region, a second region, a first spacer material, and a second spacer material. The first region includes a first material configured to include a first switchable magnetization direction. The second region includes a second material configured to include a second switchable magnetization direction. The first spacer material is between the first region and the second region. The first spacer material is configured to provide magnetic exchange coupling between the first region and the second region. Advantages of the above-described embodiments of the invention include, but are not limited to, providing the ability to use the first region to assist the process of switching the second region magnetization direction using magnetic exchange coupling provided by the third region, use the first reference layer to begin the process of switching the first region magnetization direction through STT, and use the second reference layer to assist the process of switching the second region magnetization direction through STT.

Embodiments are directed to a method of forming MTJ storage elements. A non-limiting example of the method includes forming a first reference layer having a first fixed magnetization direction, forming a first tunnel barrier layer, forming a composite free layer on an opposite side of the first tunnel barrier layer from the first reference layer, forming a second tunnel barrier on an opposite side of the free layer from the first tunnel barrier, and forming a second reference layer having a second fixed magnetization direction. The second reference layer is on an opposite side of the second tunnel barrier from the free layer. Forming the composite free layer includes forming a first region, a second region, a third region a first spacer material, and a second spacer material. The first region includes a first material configured to include a first switchable magnetization direction. The second region includes a second material configured to include a second switchable magnetization direction. The third region includes a third material configured to include a third switchable magnetization direction. The first spacer material is between the first region and the second region, and the first spacer material is configured to provide magnetic exchange coupling between the first region and the second region. The second spacer material is between the second region and the third region, and the second spacer material is configured to provide magnetic exchange coupling between the second region and the third region. Advantages of the above-described embodiments of the invention include, but are not limited to, providing the ability to use the first region to assist the process of switching the second region magnetization direction using magnetic exchange coupling provided by the first spacer region, use the third region to assist the process of switching the second region magnetization direction using magnetic exchange coupling provided by the second spacer region, use the first reference layer to begin the process of switching the first region magnetization direction through STT, and use the second reference layer to assist the process of switching the second region magnetization direction through STT.

Embodiments are directed to methods of operating MTJ storage elements. A non-limiting example of the method includes applying a write pulse having a predetermined magnitude to an MTJ storage element. The MTJ storage element includes a first reference layer having a first fixed magnetization direction, a first tunnel barrier layer, a free layer on an opposite side of the first tunnel barrier layer from the first reference layer, a second tunnel barrier on an opposite side of the free layer from the first tunnel barrier, and a second reference layer having a second fixed magnetization direction, where the second reference layer is on an opposite side of the second tunnel barrier from the free layer. The free layer includes a first region, a second region, and a firs spacer material. The first region includes a first material configured to include a first switchable magnetization direction. The second region includes a second material configured to include a second switchable magnetization direction. The first spacer material is between the first region and the second region, and the first spacer material is configured to provide magnetic exchange coupling between the first region and the second region. The method further includes, based at least in part on receiving the write pulse, generating spin torque electrons in the first reference layer material, where the spin torque electrons generated in the first reference layer material are insufficient to initiate a process of switching the second switchable magnetization direction of the second region. The method further includes, based at least in part on spin torque electrons being generated in the first reference layer material, initiating a process of switching the first switchable magnetization direction of the first region. Advantages of the above-described embodiments of the invention include, but are not limited to, providing the ability to use the first region to assist the process of switching the second region magnetization direction using magnetic exchange coupling provided by the first spacer region, use the third region to assist the process of switching the second region magnetization direction using magnetic exchange coupling provided by the second spacer region, use the first reference layer to begin the process of switching the first region magnetization direction through STT, and use the second reference layer to assist the process of switching the second region magnetization direction through STT.

Additional features and advantages are realized through the techniques of the present invention. Other embodiments and aspects of the invention are described in detail herein and are considered a part of the claimed subject matter. For a better understanding, refer to the description and to the drawings.

BRIEF DESCRIPTION OF THE DRAWINGS

The diagrams depicted herein are illustrative. There can be many variations to the diagram or the operations described therein without departing from the spirit of the invention. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the specification.

The subject matter of the invention is particularly pointed out and distinctly claimed in the claims at the conclusion of the specification. The foregoing and other features and advantages are apparent from the following detailed description taken in conjunction with the accompanying drawings in which:

DETAILED DESCRIPTION

Figure 1:
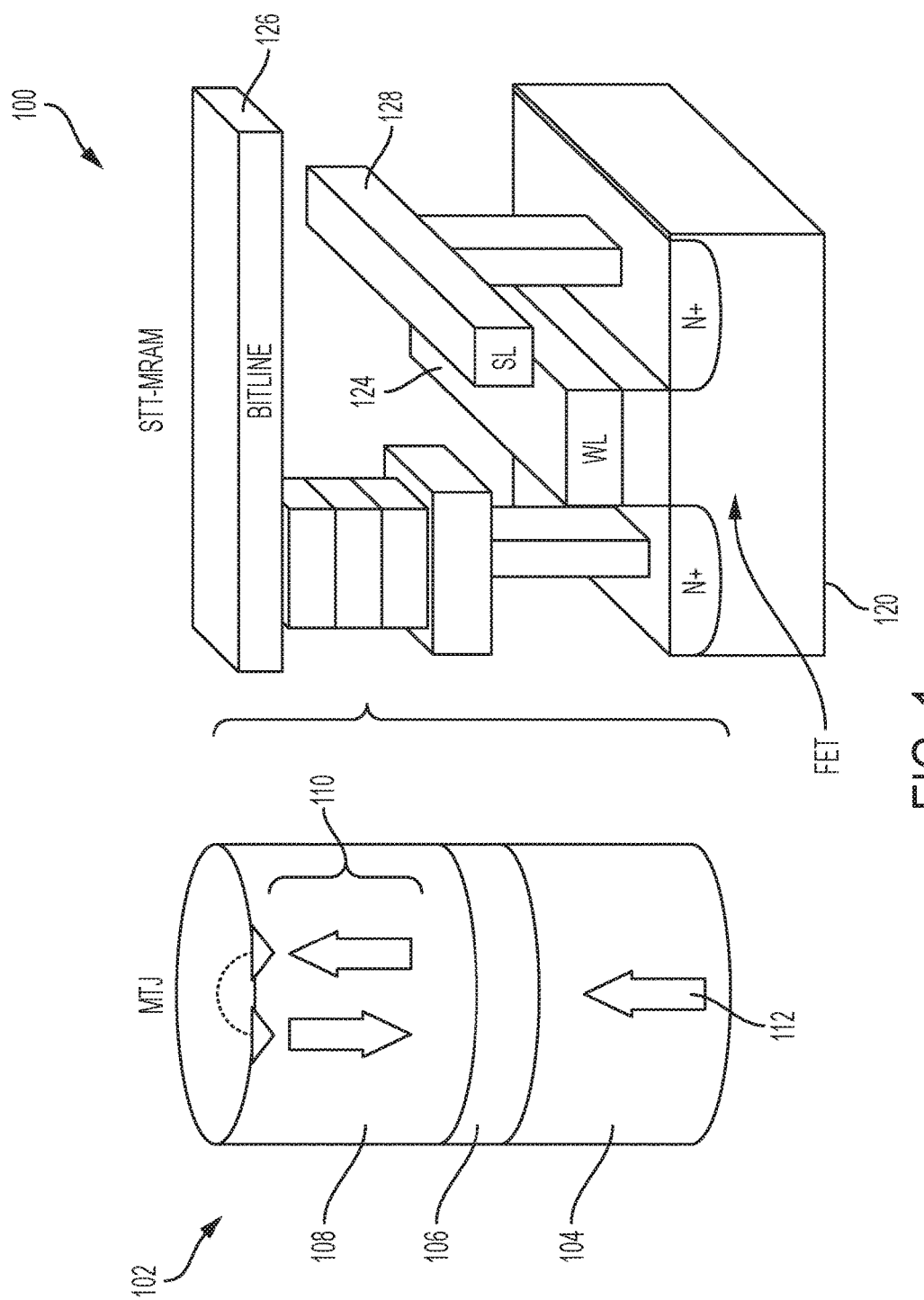
FIG. 1 depicts a block diagram of a STT-MRAM capable of utilizing a magnetic exchange coupled spin torque MTJ storage element configured according to embodiments of the present invention.

Various embodiments of the present invention are described herein with reference to the related drawings. Alternative embodiments of the invention can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For the sake of brevity, conventional techniques related to MTJ fabrication may or may not be described in detail herein. Moreover, the various tasks and process steps described herein can be incorporated into a more comprehensive procedure or process having additional steps or functionality not described in detail herein. In particular, various steps in the manufacture of STT-MRAM and MTJ devices are well known and so, in the interest of brevity, many conventional steps are only mentioned briefly herein or are omitted entirely without providing the well-known process details.

STT-MRAM, which utilizes the spin transfer torque (STT) effect to switch its MTJ free layer magnetic state, combines high speed, high density, nonvolatility, scalability, and endurance. The MTJ free layer, which is the primary memory element, is typically formed from MgO-based materials due to their fairly low switching-current density (compared with metallic spin valves) as well as large resistance and tunneling magnetoresistance (TMR) ratio compatible with read and write operations in integrated CMOS technology. For optimal operation, STT-MRAM prevents false-switching events (e.g., unintended thermal activation) while minimizing the energy dissipation during current-induced switching of the MTJ free layer (i.e., the write energy).

Minimizing the write energy while also providing an activation energy or energy barrier ($E_b$) that is sufficiently high to prevent false-switching events is a challenge in high-speed memory applications having write times in the nanosecond range (e.g., a write pulse width ≤10 ns). In high-speed memory applications, the required switching current densities are high compared with those in quasi-static or long-pulse switching. As previously described herein, in a fast switching regime, a so-called overdrive current, which is the difference between the switching current $I_c$ at a certain pulse width and the critical current $I_{c0}$, is inversely proportionally to the write pulse, as shown in Equation (1).

$$\eta \frac{I_c - I_{c0}}{e} t_p \propto \frac{m}{\mu_B} \qquad \text{Equation (1)}$$

In Equation (1), $I_c$-$I_{c0}$ is the overdrive current, $\eta$ is the spin polarization of the magnetic materials, $t_p$ is the pulse width, m is the total moment of the free layer material, and $\mu_B$ is the Bohr magneton, which is a constant. Equation (1) suggests that to minimize the switching current at a certain pulse width, it is necessary to reduce the free layer moment (m). Providing a low moment free layer is also advantageous for improving the MTJ's deep bit write error rate (WER) performance.

However, simple low moment free layers suffer from low activation energy ($E_b$), which results in poor retention. In general, the activation energy is the amount of energy required to flip the MTJ free layer's magnetic state. In order to retain data that has been written to the MTJ free layer, the activation energy must be sufficiently high to prevent random energy sources (e.g., heat) in the MTJ's operating environment from unintentionally applying enough energy to flip the MTJ free layer. Accordingly, in known STT-MRAM operating in a fast switching regime, minimizing the switching current through low moment free layers has the undesirable result of lowering activation energy ($E_b$) and data retention (e.g., ≤10 years).

Turning now to an overview of aspects of the invention, embodiments of the invention are directed to STT-MRAM that provides MTJ storage elements having a magnetic exchange coupled composite free layer configured to minimize the required magnitude of a fast switching current (e.g., a write pulse width ≤10 ns) while providing high data retention (e.g., ≥10 years). In some embodiments of the invention, the free layer is formed from a composite structure having a low moment region and a high energy barrier ($E_b$) region. In some embodiments of the invention, magnetic exchange coupling is provided between the low moment region and the high $E_b$ region by a non magnetic spacer layer positioned between the low moment region and the high $E_b$ region. In some embodiments of the invention, the low moment region is adjacent to the MTJ tunnel barrier, and the MTJ tunnel barrier is adjacent to the MTJ fixed layer.

The magnitude of the write pulse is selected to be sufficient to generate spin torque electrons in the MTJ reference layer that tunnel through the MTJ tunnel barrier and begin and/or complete the switching of the low moment region's magnetization direction. However, the magnitude of the write pulse is also selected to be insufficient to generate enough spin torque electrons in the MTJ reference layer to switch the high $E_b$ region's magnetization direction. Accordingly, the magnitude of the write pulse only needs to be high enough to generate enough spin torque electrons in the MTJ reference/fixed layer to tunnel through the tunnel barrier and into the low moment region to begin and/or complete the switching of the low moment region's magnetization direction. As previously described herein, Equation (1) suggests that, at a fast-switching pulse width, the fact that the low moment region is formed from a low moment material minimizes the required switching current.

Because the low moment region is magnetically coupled to the high $E_b$ region, as the low moment region's magnetization direction is switched it drags the high $E_b$ region's magnetization direction to switch along with it. Accordingly, the low moment region's magnetization direction is switched by the write current, and the high $E_b$ region's magnetization direction is switched by the low moment region through the effects of magnetic exchange coupling. The novel magnetic exchange coupled free layer has both low overdrive, which is determined by the low moment region at the tunnel barrier interface, and high $E_b$, which largely comes from the high $E_b$ region. By tuning the parameters (e.g., thickness, material, etc.) of the nonmagnetic spacer layer to optimize the magnetic exchange coupling strength, and by positioning the nonmagnetic spacer layer between the low moment region and the high $E_b$ region of the free layer, an optimum switching efficiency ($E_b/I_c$ at 10 ns) can be achieved.

The low moment region can be Co, Fe, Ni, and B based materials with or without light element doping. As used herein, the phrase "light element doping" refers to a doping level of about 10% of the host material. In some embodiments of the invention, light element doping is in the range from about 5% to about 30% of the host material. Examples dopants include, but are not limited to, Al, Mg, Ti, Sc, Ca, V, Cr, Mn, Ge, Si, C, Be and Ga. The low moment region's thickness can range from about 8 angstroms to about 20 angstroms. The high $E_b$ region can be Co, Fe, Ni and B based materials; Co/Pd, Co/Ir, Co/Pt, Co(Fe)/Tb, Co(Fe)/Gd, Co/Rh multilayers; or CoPt, CoPd, FePt, FePd, CoFeTb, CoFeGd alloys. The high $E_b$ region's thickness can range from about 15 angstroms to about 100 angstroms. The nonmagnetic spacer can be a metal, including, for example, Ta, W, Jr, Mo and its alloys with Fe, Co or Ni. The nonmagnetic spacer can also be an oxide, including, for example, MgO, AlOx, TiOx, TaOx, WOx or mixtures thereof. The nonmagnetic spacer layer's thickness can range from about 2 angstroms to about 20 angstroms.

In some embodiments of the invention, the switching current can be driven even lower by providing a STT-MRAM MTJ providing the above-described composite free layer, along with a double-tunnel-junction formed from a bottom reference layer, a bottom tunnel barrier, a top reference layer and a top tunnel barrier. In some embodiments, the bottom reference layer is positioned on one side of the bottom tunnel barrier, and the composite free layer is positioned on an opposite side of the bottom tunnel barrier from the bottom reference layer. In some embodiments, the top reference layer is positioned on one side of the top tunnel barrier, and the composite free layer is positioned on an opposite side of the top tunnel barrier from the top reference layer. In addition to the impact of the composite free layer, switching current is driven even lower in this configuration because the write pulse generates spin torque electrons in the bottom reference layer and the top reference layer. The spin torque electrons generated in the bottom reference layer are applied to the low-moment region through the bottom tunnel barrier to begin and/or complete the switching of the low moment region's magnetization direction. The spin torque electrons generated in the top reference layer are applied to the high $E_b$ region through the top tunnel barrier to work substantially in tandem with the magnetic exchange coupling between the low moment region and the high $E_b$ region to switch the high $E_b$ region's magnetization direction. As described above, because the low moment region is magnetically coupled to the high $E_b$ region, as the low moment region's magnetization direction is switched it drags the high $E_b$ region's magnetization direction to switch along with it. Accordingly, the low moment region's magnetization direction is switched by the write current, and the high $E_b$ region's magnetization direction is switched by the low moment region through the effects of magnetic exchange coupling, as well as by spin torque electrons provided by the top reference layer through the top tunnel barrier.

In some embodiments of the invention, the switching current can be driven even lower by providing a STT-MRAM MTJ having an alternative configuration of the above-described composite free layer, along with a double tunnel junction formed from a bottom reference layer, a bottom tunnel barrier, a top reference layer and a top tunnel barrier. In some embodiments of the invention, the alternative composite free layer includes a first low moment region, a first nonmagnetic spacer layer, a high $E_b$ region, a second nonmagnetic spacer layer, and a second low moment region. In some embodiments, the first nonmagnetic spacer layer is between the high $E_b$ region and the first low moment region, and the second nonmagnetic spacer layer is between the high $E_b$ region and the second low moment region. In some embodiments, the bottom reference layer is positioned on one side of the bottom tunnel barrier, and the alternative composite free layer is positioned on an opposite side of the bottom tunnel barrier from the bottom reference layer. In some embodiments, the top reference layer is positioned on one side of the top tunnel barrier, and the alternative composite free layer is positioned on an opposite side of the top tunnel barrier from the top reference layer. Switching current is driven even lower in this configuration because the write pulse generates spin torque electrons in the bottom reference layer and the top reference layer. The spin torque electrons generated in the bottom reference layer are applied to the first low-moment region through the bottom tunnel barrier to begin and/or complete the switching of the first low moment region's magnetization direction. The spin torque electrons generated in the top reference layer are applied to the second low-moment region through the top tunnel barrier to begin and/or complete the switching of the second low moment region's magnetization direction. As the magnetization directions of the first and second low moment regions switch, both the first and the second low moment regions assist in switching the high $E_b$ region's magnetization direction through magnetic exchange coupling. More specifically, the first low moment region through magnetic exchange coupling provided by the first nonmagnetic spacer layer assists in switching the high $E_b$ region's magnetization direction, and the second low moment region through magnetic exchange coupling provided by the second nonmagnetic spacer layer assists in switching the high $E_b$ region's magnetization direction. Because the first and second low moment regions are magnetically coupled to the high $E_b$ region, as the first and second low moment region magnetization directions are switched, they drag the high $E_b$ region's magnetization direction to switch along with them. Accordingly, the first and second low moment region magnetization directions are switched by the write current, and the high $E_b$ region's magnetization direction is switched by the first and second low moment regions through the effects of magnetic exchange coupling.

The thicknesses of the respective layers of the novel MTJ storage elements described herein can vary according to design considerations. For example, the thicknesses of the layers of the novel MTJ storage element can be designed to have predetermined thicknesses, to have thicknesses within predetermined ranges, to have thicknesses having fixed ratios with respect to each other, or to have thicknesses based on any other consideration or combination of considerations in accordance with the various functionalities described herein.

Figure 2:
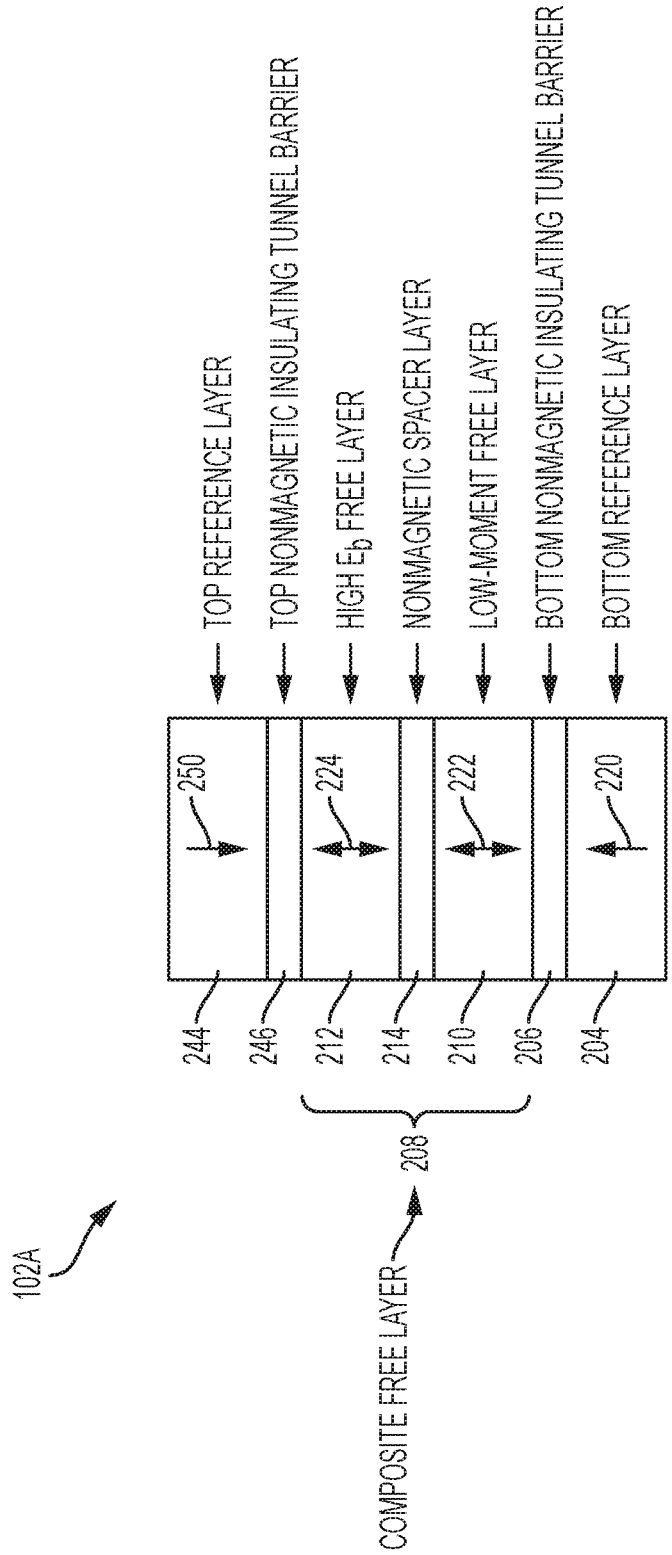
FIG. 2 depicts a block diagram of a magnetic exchange coupled spin torque MTJ configured according to embodiments of the present invention.

Turning now to a more detailed description of aspects of the present invention, FIG. 2 depicts a block diagram illustrating an example configuration of a double-tunnel-junction, magnetic exchange coupled spin torque MTJ-based storage element 102A according to embodiments of the present invention. The MTJ 102A can be implemented in the STT-MRAM 100 (shown in FIG. 1) in the same manner as the MTJ 102. The MTJ 102A includes a bottom magnetic reference layer 204, a bottom dielectric tunnel barrier 206, a composite free layer 208, a top magnetic reference layer 244, and a top tunnel barrier 246, configured and arranged as shown. The composite free layer 208 includes a first region 210, a second region 212, and an exchange coupling region 214 disposed between the first region 210 and the second region 212. In some embodiments of the invention, the first region 210 is implemented as a low-moment magnetic layer, the second region 212 is implemented as a high $E_b$ magnetic layer, and the exchange coupling region 214 is implemented as a nonmagnetic spacer layer. The magnetic layers that form the MTJ 102A have perpendicular magnetization, which means that the magnetization directions of all of the magnetic layers are perpendicular to the plane of the film (either up or down). The reference layers 204, 244 have their magnetization directions set in opposite directions. The free layers 210, 212 have their magnetization directions parallel to each other (when not being written), i.e., all are up or all are down.

The bottom magnetic reference layer 204 is formed and configured such that its magnetization direction 220 is fixed. The top magnetic reference layer 244 is formed and configured such that its magnetization direction 250 is fixed. The first region 210 and the second region 212 are formed and configured in a manner that provides them with switchable magnetization directions 222, 224, respectively. The exchange coupling region 214 is nonmagnetic. However, the exchange coupling region 214 is configured to magnetically couple the first region 210 and the second region 212. More specifically, the exchange coupling region is configured to provide a predetermined magnetic exchange coupling strength from the first region 210 across the exchange coupling region 214 to the second region 212. The parameters (e.g., material, thickness, etc.) of the exchange coupling region 214 are selected such that the resulting predetermined magnetic exchange coupling results in optimal switching efficiency ($E_b/I_c$ at 10 ns). In some embodiments, the exchange coupling region 214 can be a nonmagnetic spacer formed from metal, including, for example, Ta, W, Jr, Mo and its alloys with Fe, Co or Ni. The exchange coupling region 214 can also be an oxide, including, for example, MgO, AlOx, TiOx, TaOx, WOx or mixtures thereof. The thickness of the exchange coupling region 214 can range from about 1 angstroms to about 10 angstroms.

The first region 210 can be formed from a low moment magnetic material. The magnetic moment of a magnet is a quantity that determines the torque it will experience in an external magnetic field. A loop of electric current, a bar magnet, an electron, a molecule, and a planet all have magnetic moments. A magnetic material can be considered "low moment" if its $M_s t$ product is $\leq$ about 0.12 emu/cm$^2$, where $M_s$ is the material's saturation magnetization, t is the material's thickness, and emu is a cgs (centimetre-gram-second) unit for measuring magnetic moment. The first region 210 can be Co, Fe, Ni, and B based materials with or without light element doping. As used herein, the phrase "light element doping" refers to a doping level of about 10% of the host material. In some embodiments of the invention, light element doping is in the range from about 5% to about 30% of the host material. Examples dopants include, but are not limited to, Al, Mg, Ti, Sc, Ca, V, Cr, Mn, Ge, Si, C, Be and Ga. The thickness of the first region 210 can range from about 8 angstroms to about 20 angstroms. In general, a layer of material's magnetic moment is related to the layer's thickness such that the thinner the layer the lower the magnetic moment. Accordingly, the thickness of the first region 210 is selected to achieve a desired magnetic moment, which is selected to achieve a desired switching current for the MTJ 102A.

The second region 212 can be formed from a high $E_b$ magnetic layer. A magnetic layer can be considered to have a high $E_b$ if its $E_b$ is sufficient to satisfy the data retention requirement for targeted application. This translates to an activation energy (or energy barrier) $E_b$ that is within the range from about 60 to about 100 kT (k=the Boltzmann constant, and T=temperature) for approximately 10 year data retention. The second region 212 can be Co, Fe, Ni and B based materials; Co/Pd, Co/Ir, Co/Pt, Co(Fe)/Tb, Co(Fe)/Gd, Co/Rh multilayers; or CoPt, CoPd, FePt, FePd, CoFeTb, CoFeGd alloys. The thickness of the second region 212 can range from about 10 angstroms to about 100 angstroms. In general, a layer of material's energy barrier $E_b$ is related to the layer's thickness such that the thicker the layer the higher the energy barrier $E_b$. Accordingly, the thickness of the second region 212 is selected to achieve a desired energy barrier $E_b$, which is selected to meet a desired data retention requirement for the target application.

The bottom tunnel barrier layer 206 and the top tunnel barrier 246 can each be formed from a relatively thin (e.g., about 10 angstroms) layer of dielectric material (e.g., MgO). When two conducting electrodes (e.g., bottom reference/fixed layer 204 and the first region 210, and/or top reference/fixed layer 244 and the second region 212) are separated by a thin dielectric layer (e.g., tunnel barrier layers 206 and/or 246), electrons can tunnel through the dielectric layers resulting in electrical conduction. The electron tunneling phenomenon arises from the wave nature of the electrons, and the resulting junction electrical conductance is determined by the evanescent state of the electron wave function within the tunnel barriers. Accordingly, the tunnel barriers 206, 246 are configured to be thin enough to allow electrons (specifically, spin torque electrons) from the bottom reference layer 204 or the top reference layer 244 to quantum mechanically tunnel through the tunnel barriers 206, 246, respectively. The tunnel barriers 206, 246 are also configured to be thick enough to decouple the first region 210 of the composite free layer 208 from the bottom reference layer 204, and to decouple the second region 212 of the composite free layer 208 from the top reference layer 244, such that the magnetization direction 222 of the first region 210 and the magnetization direction 224 of the second region 212 are free to flip back and forth.

With the optimal exchange coupling strength, the composite free layer design, and the double-tunnel-junction design, the magnitude of the write pulse needed to switch the whole exchange coupled composite free layer 208 will be lower than what is needed to switch a simple free layer with a single magnetic tunnel junction and the same total activation energy $E_b$. Thus the exchange coupled composite free layer 208 and the double-tunnel-junction improve switching efficiency defined as $E_b/I_{c10ns}$. The composite free layer structure and double-tunnel-junction also improve the write-error rate performance of the MTJ 102A. A write pulse applied to the MTJ 102A, according to embodiments of the invention, needs to be sufficient to begin switching the low moment first region's magnetization direction 222 but insufficient to switch the high $E_b$ second region's magnetization direction 224.

Because the low moment first region 210 is magnetically coupled to the high $E_b$ second region 212, as the low moment region's magnetization direction 222 is switched it drags the high $E_b$ region's magnetization direction 224 to switch along with it. Accordingly, the low moment region's magnetization direction 222 is switched by the write current, and the high $E_b$ region's magnetization direction 224 is assisted in switching by the low moment first region 210 through the effects of magnetic exchange coupling. The novel magnetic exchange coupled composite free layer 208, according to embodiments of the invention, has both low overdrive, which is determined by the low moment region 210 at the tunnel barrier interface, and high $E_b$, which largely comes from the high $E_b$ region 212. By optimizing the magnetic exchange coupling strength between the low moment first region 210 and the high $E_b$ second region 212 across the nonmagnetic exchange coupling region 214, an optimum switching efficiency ($E_b/I_c$ at 10 ns) can be achieved.

In addition to the impact of the composite free layer 208, switching current is driven even lower in MTJ 102A because the write pulse generates spin torque electrons in the bottom reference layer 204 and the top reference layer 244. The spin torque electrons generated in the bottom reference layer 204 are applied to the low-moment first region 210 through the bottom tunnel barrier 206 to begin and/or complete the switching of the low moment region's magnetization direction 222. The spin torque electrons generated in the top reference layer 244 are applied to the high $E_b$ second region 212 through the top tunnel barrier 246 to work substantially in tandem with the magnetic exchange coupling between the low moment first region 210 and the high $E_b$ second region 212 to switch the high $E_b$ second region's magnetization direction 224. As described above, because the low moment first region 210 is magnetically coupled to the high $E_b$ second region 212, as the low moment first region's magnetization direction 222 is switched it drags the high $E_b$ second region's magnetization direction 224 to switch along with it. Accordingly, the low moment first region's magnetization direction 222 is switched by the write current, and the high $E_b$ second region's magnetization direction 224 is switched by the low moment first region 210 through the effects of magnetic exchange coupling, as well as by spin torque electrons provided by the top reference layer 244 through the top tunnel barrier 246.

Figure 3:
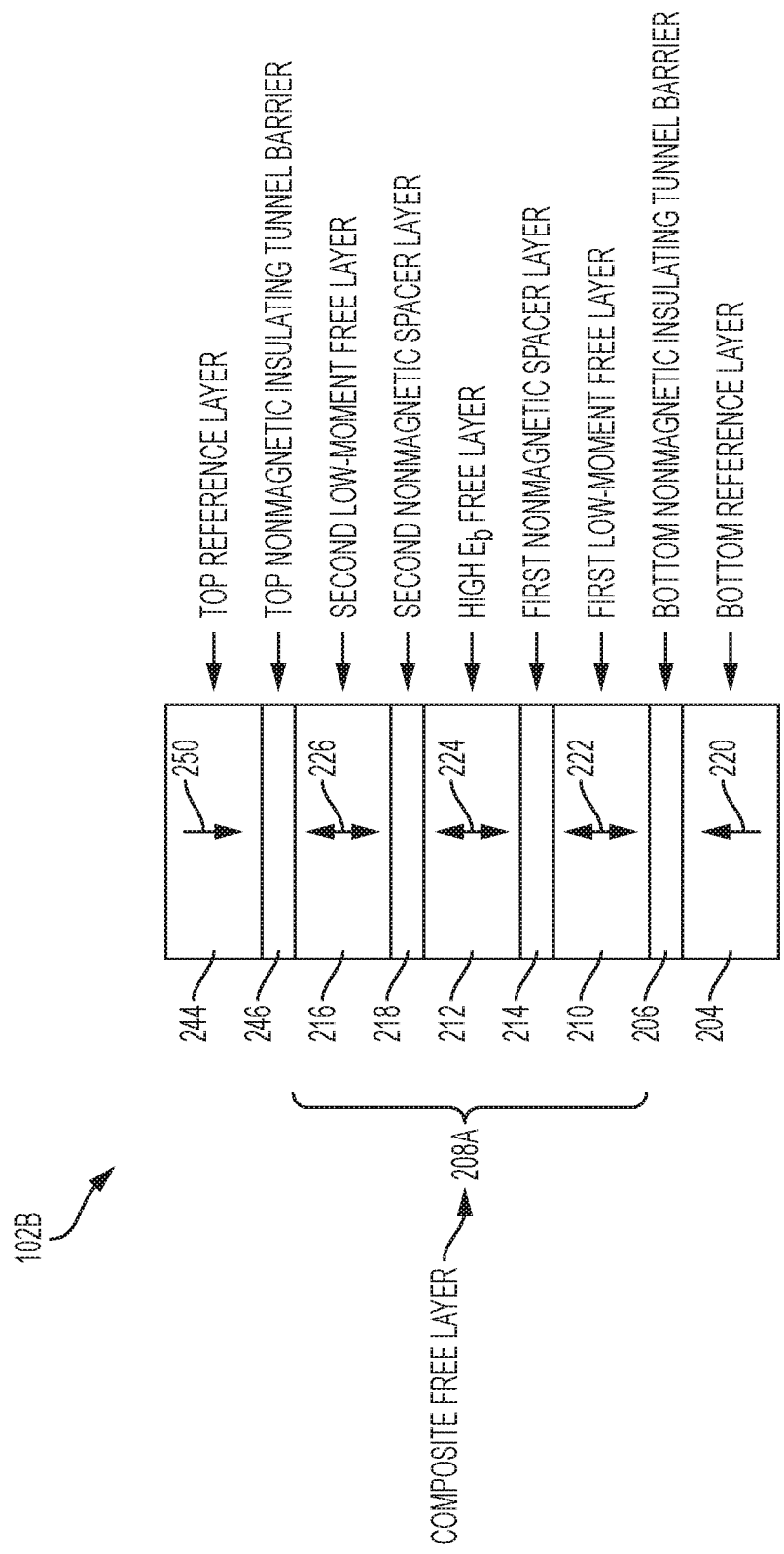
FIG. 3 depicts a block diagram of a magnetic exchange coupled spin torque MTJ configured according to embodiments of the present invention.

FIG. 3 depicts a block diagram illustrating an example configuration of a double-tunnel-junction magnetic exchange coupled spin torque MTJ-based storage element 102B according to embodiments of the present invention. The MTJ 102B can be implemented in the STT-MRAM 100 (shown in FIG. 1) in the same manner as the MTJ 102. The MTJ 102B is configured substantially the same as the MTJ 102A (shown in FIG. 2) except for the configuration and operation of the composite free layer 208A of the MTJ 102B, which is described in greater detail below.

As depicted in FIG. 3, the MTJ 102B includes a bottom magnetic reference layer 204, a bottom dielectric tunnel barrier 206, a composite free layer 208A, a top magnetic reference layer 244, and a top tunnel barrier 246, configured and arranged as shown. The composite free layer 208A includes a first region 210, a second region 212, a third region 216, a first exchange coupling region 214 disposed between the first region 210 and the second region 212, and a second exchange coupling region 218 disposed between the second region 212 and the third region 214. In some embodiments of the invention, the first region 210 is implemented as a low-moment magnetic layer, the second region 212 is implemented as a high $E_b$ magnetic layer, the first region 210 is implemented as a low-moment magnetic layer, and the first and second exchange coupling regions 214, 218 are each implemented as a nonmagnetic spacer layer. The magnetic layers that form the MTJ 102B have perpendicular magnetization, which means that the magnetization directions of all of the magnetic layers are perpendicular to the plane of the film (either up or down). The reference layers 204, 244 have their magnetization directions set in opposite directions. The free layers 210, 212, 216 have their magnetization directions parallel to each other (when not being written), i.e., all are up or all are down.

The bottom magnetic reference layer 204 is formed and configured such that its magnetization direction 220 is fixed. The top magnetic reference layer 244 is formed and configured such that its magnetization direction 250 is fixed. The first region 210, the second region 212 and the third region 216 are formed and configured in a manner that provides them with switchable magnetization directions 222, 224, 226 respectively. The first and second exchange coupling regions 214, 218 are nonmagnetic. However, the first exchange coupling region 214 is configured to magnetically couple the first region 210 and the second region 212, and the second exchange coupling region 218 is configured to magnetically couple the second region 212 and the third region 216. More specifically, the first exchange coupling region 214 is configured to provide a predetermined magnetic exchange coupling strength from the first region 210 across the second exchange coupling region 214 to the second region 212. Similarly, the second exchange coupling region 218 is configured to provide a predetermined magnetic exchange coupling strength from the second region 212 across the second exchange coupling region 218 to the second region 216. The parameters (e.g., material, thickness, etc.) of the exchange coupling regions 214, 218 are selected such that the resulting predetermined magnetic exchange coupling results in optimal switching efficiency ($E_b/I_c$ at 10 ns). In some embodiments, the exchange coupling regions 214, 218 can each be a nonmagnetic spacer formed from metal, including, for example, Ta, W, Jr, Mo and its alloys with Fe, Co or Ni. The exchange coupling regions 214, 218 can also each be an oxide, including, for example, MgO, AlOx, TiOx, TaOx, WOx or mixtures thereof. The thickness of each exchange coupling region 214, 218 can range from about 2 angstroms to about 20 angstroms.

The first region 210 and the third region 216 can each be formed from a low moment magnetic material. The magnetic moment of a magnet is a quantity that determines the torque it will experience in an external magnetic field. A loop of electric current, a bar magnet, an electron, a molecule, and a planet all have magnetic moments. A magnetic material can be considered "low moment" if its $M_s t$ product is ≤ about 0.12 emu/cm², where $M_s$ is the material's saturation magnetization, t is the material's thickness, and emu is a cgs (centimetre-gram-second) unit for measuring magnetic moment. The first region 210 and the third region 216 can each be Co, Fe, Ni, and B based materials with or without light element doping. As used herein, the phrase "light element doping" refers to a doping level of about one to about ten dopant atoms per about 100 atoms of the host material. Examples dopants include, but are not limited to, Al, Mg, Ti, Sc, Ca, V, Cr, Mn, Ge, Si, C, Be and Ga. The thickness of the first region 210 and the third region 216 can each range from about 8 angstroms to about 20 angstroms. In general, a layer of material's magnetic moment is related to the layer's thickness such that the thinner the layer the lower the magnetic moment. Accordingly, the thickness of the first region 210 and the third region 216 are each selected to achieve a desired magnetic moment, which is selected to achieve a desired switching current for the MTJ 102B.

The second region 212 can be formed from a high $E_b$ magnetic layer. A magnetic layer can be considered to have a high $E_b$ if its $E_b$ is sufficient to satisfy the data retention requirement for targeted application. This translates to an activation energy (or energy barrier) $E_b$ that is within the range from about 60 to about 100 kT (k=the Boltzmann constant, and T=temperature) for approximately 10 year data retention. The second region 212 can be Co, Fe, Ni and B based materials; Co/Pd, Co/Ir, Co/Pt, Co(Fe)/Tb, Co(Fe)/Gd, Co/Rh multilayers; or CoPt, CoPd, FePt, FePd, CoFeTb, CoFeGd alloys. The thickness of the second region 212 can range from about 15 angstroms to about 100 angstroms. In general, a layer of material's energy barrier $E_b$ is related to the layer's thickness such that the thicker the layer the higher the energy barrier $E_b$. Accordingly, the thickness of the second region 212 is selected to achieve a desired energy barrier $E_b$, which is selected to meet a desired data retention requirement for the target application.

The bottom tunnel barrier layer 206 and the top tunnel barrier 246 can each be formed from a relatively thin (e.g., about 10 angstroms) layer of dielectric material (e.g., MgO). When two conducting electrodes (e.g., bottom reference/fixed layer 204 and the first region 210, and/or top reference/fixed layer 244 and the third region 216) are separated by a thin dielectric layer (e.g., tunnel barrier layers 206 and/or 246), electrons can tunnel through the dielectric layers resulting in electrical conduction. The electron tunneling phenomenon arises from the wave nature of the electrons, and the resulting junction electrical conductance is determined by the evanescent state of the electron wave function within the tunnel barriers. Accordingly, the tunnel barriers 206, 246 are configured to be thin enough to allow electrons (specifically, spin torque electrons) from the bottom reference layer 204 or the top reference layer 244 to quantum mechanically tunnel through the tunnel barriers 206, 246, respectively. The tunnel barriers 206, 246 are also configured to be thick enough to decouple the first region 210 of the composite free layer 208A from the bottom reference layer 204, and to decouple the third region 216 of the composite free layer 208A from the top reference layer 244, such that the magnetization direction 222 of the first region 210 and the magnetization direction 226 of the third region 216 are free to flip back and forth.

With the optimal exchange coupling strength, the composite free layer design, and the double-tunnel-junction design, the magnitude of the write pulse needed to switch the whole exchange coupled composite free layer 208A will be lower than what is needed to switch a simple free layer with a single magnetic tunnel junction and the same total activation energy $E_b$. Thus, the exchange coupled composite free layer 208A and the double-tunnel-junction improve switching efficiency defined as $E_b/I_{c10ns}$. The composite free layer structure and double-tunnel-junction also improve the write-error rate performance of the MTJ 102B. A write pulse applied to the MTJ 102B, according to embodiments of the invention, needs to be sufficient to begin switching the low moment first region's magnetization direction 222 and the low moment third region's magnetization direction 226 but insufficient to switch the high $E_b$ second region's magnetization direction 224.

Because the low moment first region 210 is magnetically coupled to the high $E_b$ second region 212, as the low moment first region's magnetization direction 222 is switched by spin torque electrons from the bottom reference layer 204, the low moment first region 210 drags the high $E_b$ second region's magnetization direction 224 to switch along with it. Similarly, because the low moment third region 216 is also magnetically coupled to the high $E_b$ second region 212, as the low moment third region's magnetization direction 226 is switched by spin torque electrons from the top reference layer 244, the low moment third region 216 also drags the high $E_b$ second region's magnetization direction 224 to switch along with it. Accordingly, the low moment first region's magnetization direction 222 and the low moment third region's magnetization direction 226 are switched spin torque electrons generated by the write current, and the high $E_b$ region's magnetization direction 224 is switched by magnetic exchange coupling with both the low moment first region 210 and the low moment second region 216. The novel double-tunnel-junction magnetic exchange coupled composite free layer 208A, according to embodiments of the invention, has both low overdrive, which is determined by the low moment regions 210, 216 at the tunnel barrier interfaces, and high $E_b$, which largely comes from the high $E_b$ second region 212. By optimizing the magnetic exchange coupling strength between the low moment regions 210, 216 and the high $E_b$ second region 212 across the nonmagnetic exchange coupling regions 214, 218, an optimum switching efficiency ($E_b/I_c$ at 10 ns) can be achieved.

Figure 4A:
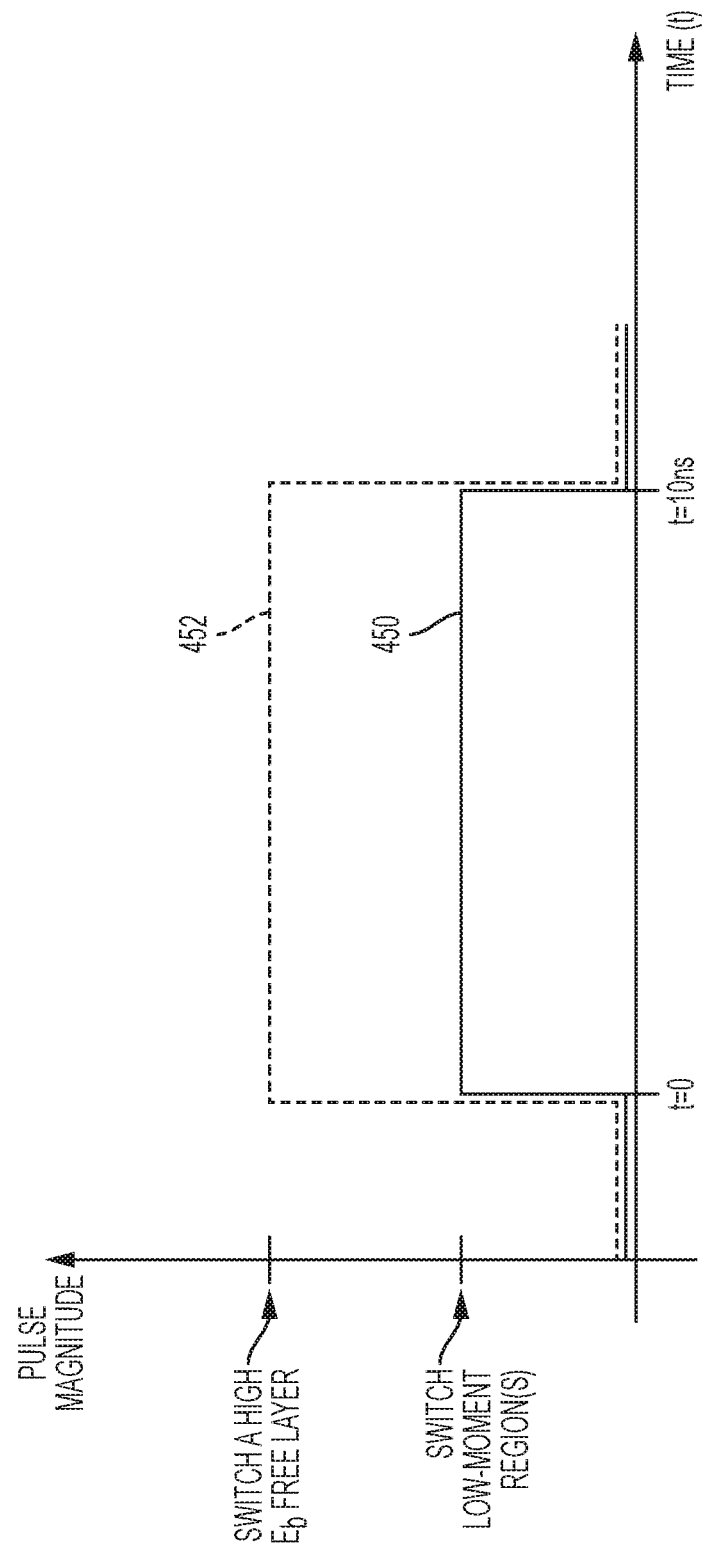
FIG. 4A depicts a write pulse that can be applied to a magnetic exchange coupled spin torque MTJ configured according to embodiments of the invention.

A non-limiting example of a write operation of the MTJs 102A and 102B will now be described with reference to FIGS. 4A, 4B, and 4C. FIG. 4A depicts a diagram of a write pulse 450 according to embodiments of the invention. The write pulse 450 is applied to the MTJs 102A, 102B (shown in FIGS. 4B and 4C) and operates, according to embodiments of the invention, to change the magnetization directions 222, 226 of the low moment regions 210, 216, respectively, of the free layers 208, 208 from pointing up to pointing down (or from pointing down to pointing up). However, the write pulse magnitude of the write pulse 450 is selected, according to embodiments of the invention, to also be insufficient to change the magnetization direction 224 of the high $E_b$ second region 212 of the free layers 208, 208A. For comparison, a write pulse 452 is depicted to show an example of the higher write pulse magnitude that would be required if write current were used to switch a high $E_b$ free layer. The write pulses 450, 452 are depicted in a diagram/graph that shows the pulse magnitudes of the write pulses 450, 452 over time (t). In the depicted embodiment, the write pulses 450, 452 include a write pulse duration of about ten (10) nanoseconds, which places the write pulses 450, 452 within what is generally considered a "fast-switching" regime. For ease of illustration, one write pulse 450 is used to represent the switching current from MTJ 102A or MTJ 102B. In practice, however, it is expected that the MTJ 102B could achieve a lower switching current that MTJ 102A.

Figure 4B:
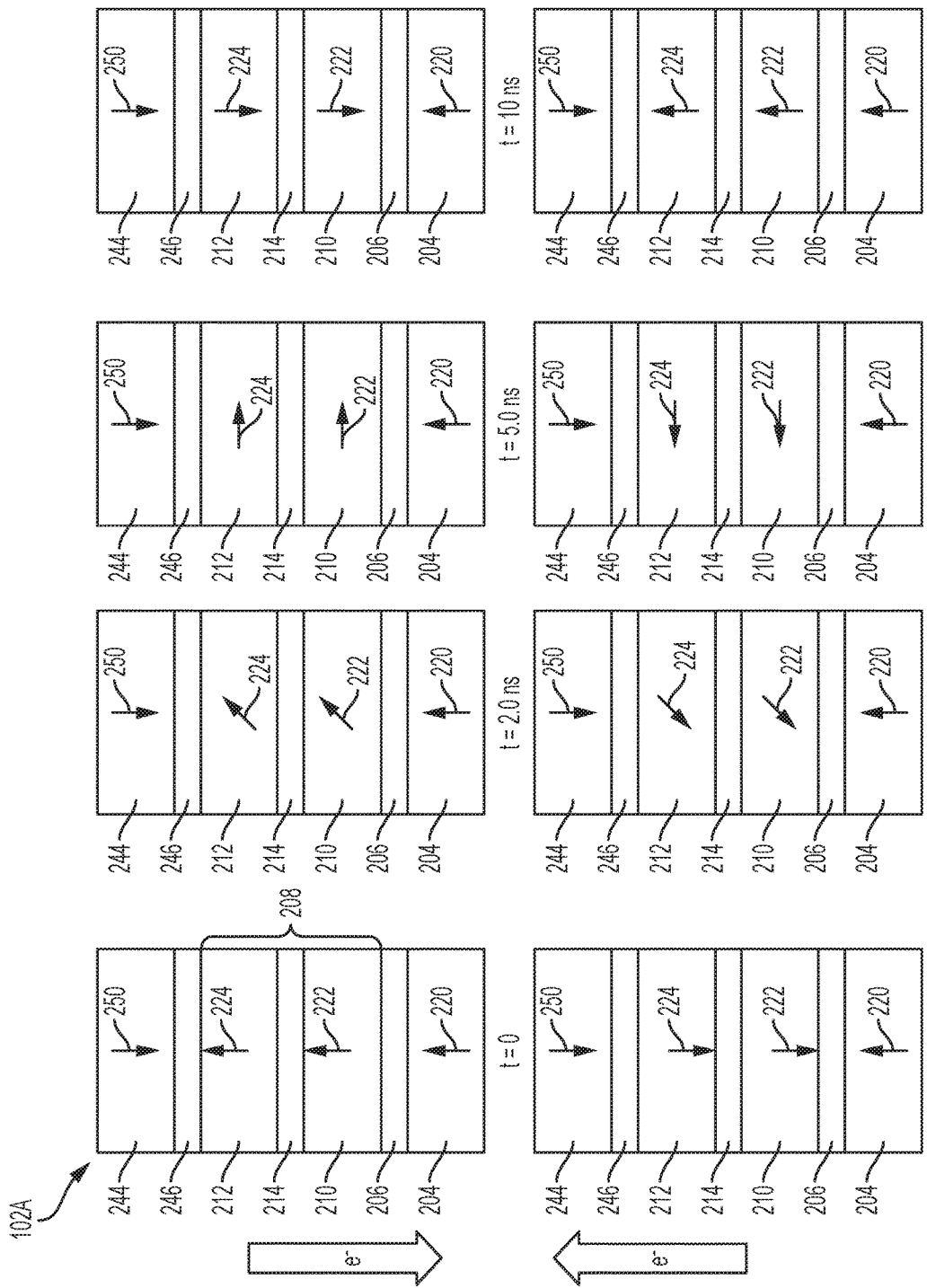
FIG. 4B depicts a sequence of diagrams illustrating a non-limiting example of a write operation of a magnetic exchange coupled spin torque MTJ configured according to embodiments of the invention.

FIG. 4B depicts a sequence of diagrams illustrating a non-limiting example of how the magnetization directions 222, 224 of the MTJ 102A can change over time during the initial application of a write pulse (i.e., switching current) such as write pulse 450 according to embodiments of the invention. FIG. 4B depicts a sequence of four diagrams along the top of FIG. 4B, where each diagram illustrates the magnetization directions 220, 222, 224, 250 of the MTJ 102A at a particular time (t) and with a downward current direction (e-) during application of the write pulse 450 shown in FIG. 4A. Examples of the magnetization directions 220, 222, 224, 250 of the MTJ 102A are depicted at t=zero (0) ns, t=2.0 ns, t=5.5 ns, and t=10 ns. The diagrams shown for each time are for illustration purposes and are not intended to convey precise positions of the magnetization directions 220, 222, 224, 250 at the exact points in time of zero (0) ns, 2.0 ns, 5.0 ns, and 10.0 ns. Instead, the diagrams shown in FIG. 4B are intended to convey an example of how the general progression of the changes in the magnetization directions 220, 222, 224, 250 can occur according to embodiments of the invention, and not the specific times at which the changes occur, or the specific order of the changes. For example, the magnetization directions of the free layers of 208 may or may not change at the same time (i.e., one free layer magnetization direction can change first with the other free layer magnetization direction(s) following).

The diagram at t=zero (0) depicts the magnetization directions 220, 222, 224, 250 of the MTJ 102A at the start time of the write pulse 450. At t=2.0 ns the write pulse 450 has started the process of generating spin torque electrons in the bottom reference layer 204, which starts the process of switching the magnetization direction 222 of the low moment first region 210. Similarly, at t=2.0 ns the write pulse 450 has started the process of generating spin torque electrons in the top reference layer 244, which starts the process of switching the magnetization direction 224 of the high $E_b$ second region 212.

At t=5.0 ns, the write pulse 450 continues the process of changing the magnetization direction 222 of the low moment first region 210, as well as the magnetization direction 224 of the high $E_b$ second region 212. The magnitude of the write pulse 450 need not be sufficient to switch the magnetization direction 224 of the high $E_b$ second region 212, because, by t=5.0 ns, the magnetization direction 222 of the low moment first region 210 has begun to influence the magnetization direction 224 of the high $E_b$ second region 212 through magnetic exchange coupling provided by the nonmagnetic exchange coupling region 214. Because the low moment first region 210 is magnetically coupled to the high $E_b$ second region 212, as the low moment region's magnetization direction 222 is switched it drags the high $E_b$ region's magnetization direction 224 to switch along with it. Accordingly, the low moment region's magnetization direction 222 is switched by the write current 450, and the high $E_b$ region's magnetization direction 224 is switched by both the write current 450 and the low moment region 210. The write current 450 influences high $E_b$ region's magnetization direction 224 through the influence of spin torque electrons generated in the top reference layer 244. The low moment region 210 influences the high $E_b$ region's magnetization direction 224 through the effects of magnetic exchange coupling exerted by the nonmagnetic exchange coupling region 214. The novel double-tunnel-junction, magnetic exchange coupled free layer 208 of the MTJ 102A has both low overdrive, which is determined by the low moment first region 210 at the interface with the tunnel barrier 206, and high $E_b$, which largely comes from the high $E_b$ second region 212. By tuning the parameters (e.g., thickness, material, etc.) of the nonmagnetic exchange coupling region 214 to optimize the magnetic exchange coupling strength, and by positioning the nonmagnetic exchange coupling region 214 between the low moment first region 210 and the high $E_b$ second region 212 of the composite free layer 208, an optimum switching efficiency ($E_b/I_c$ at 10 ns) can be achieved. By t=10.0 ns, the novel process of switching the composite free layer's magnetization directions 222, 224 has completed.

FIG. 4B also depicts a sequence of four diagrams along the bottom of FIG. 4B, where each diagram illustrates the magnetization directions 220, 222, 224, 250 of the MTJ 102A at a particular time (t) and with an upward current direction (e-) during application of a negative version of the write pulse 450 shown in FIG. 4A. The switching operation depicted by the sequence of four diagrams along the bottom of FIG. 4B proceeds in substantially the same manner as the switching operation depicted by the sequence of four diagrams along the top of FIG. 4B, except the current direction is upward, and the composite free layer magnetization directions 222, 224 are switched from pointing downward to pointing upward.

Figure 4C:
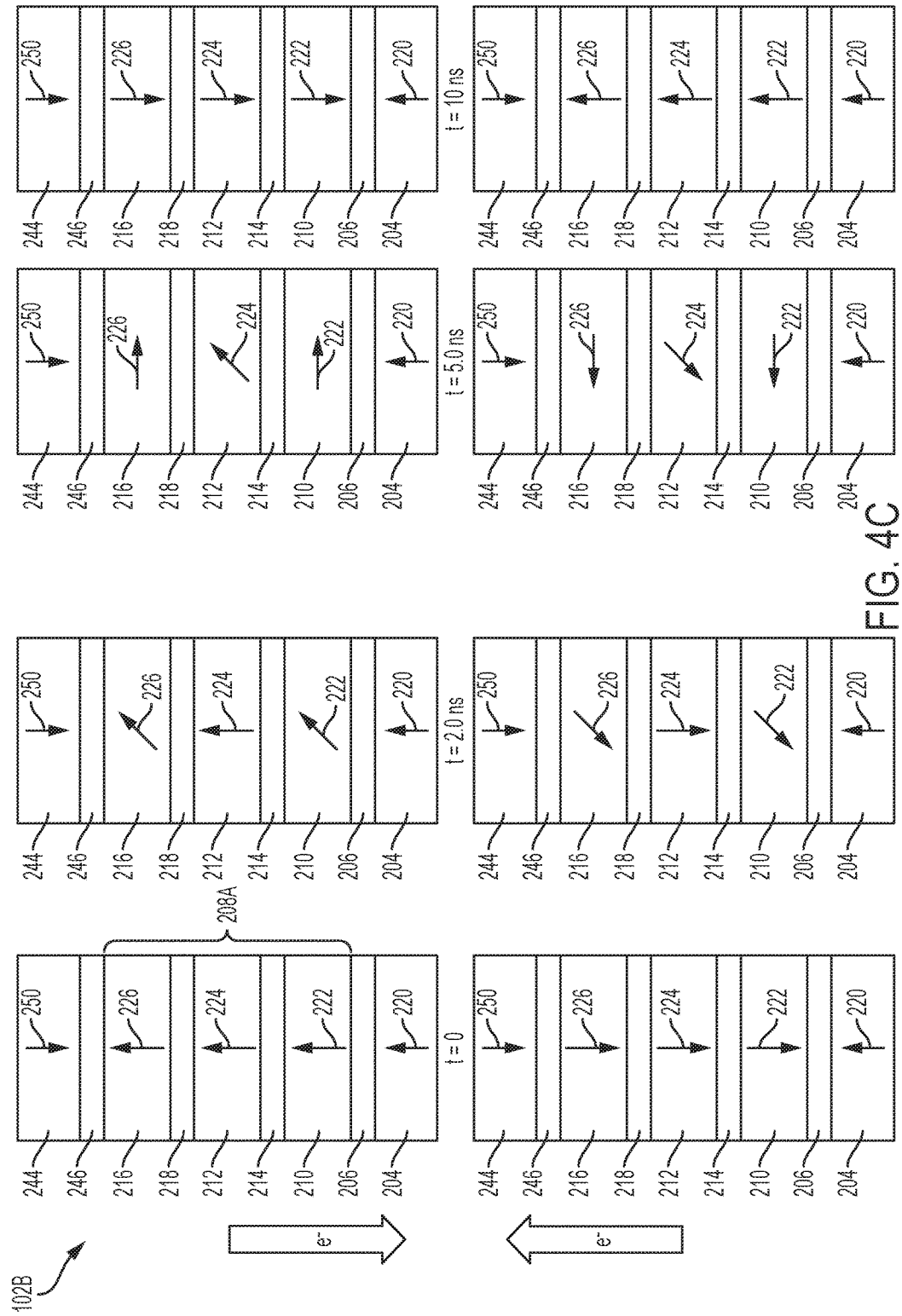
FIG. 4C depicts a sequence of diagrams illustrating a non-limiting example of a write operation of a magnetic exchange coupled spin torque MTJ configured according to embodiments of the invention.

FIG. 4C depicts a sequence of diagrams illustrating a non-limiting example of how the magnetization directions 222, 224, 226 of the MTJ 102B can change over time during the initial application of a write pulse (i.e., switching current) such as write pulse 450 according to embodiments of the invention. FIG. 4C depicts a sequence of four diagrams along the top of FIG. 4C, where each diagram illustrates the magnetization directions 220, 222, 224, 226, 250 of the MTJ 102B at a particular time (t) and with a downward current direction (e-) during application of the write pulse 450 shown in FIG. 4A. Examples of the magnetization directions 220, 222, 224, 226, 250 of the MTJ 102B are depicted at t=zero (0) ns, t=2.0 ns, t=5.5 ns, and t=10 ns. The diagrams shown for each time are for illustration purposes and are not intended to convey precise positions of the magnetization directions 220, 222, 224, 226, 250 at the exact points in time of zero (0) ns, 2.0 ns, 5.0 ns, and 10.0 ns. Instead, the diagrams shown in FIG. 4C are intended to convey an example of how the general progression of the changes in the magnetization directions 220, 222, 224, 226, 250 can occur according to embodiments of the invention, and not the specific times at which the changes occur, or the specific order of the changes. For example, the magnetization directions of the free layers of 208A may or may not change at the same time (i.e., one free layer magnetization direction can change first with the other free layer magnetization direction(s) following).

The diagram at t=zero (0) depicts the magnetization directions 220, 222, 224, 226, 250 of the MTJ 102B at the start time of the write pulse 450. At t=2.0 ns the write pulse 450 has started the process of generating spin torque electrons in the bottom reference layer 204, which starts the process of switching the magnetization direction 222 of the low moment first region 210. Similarly, at t=2.0 ns the write pulse 450 has started the process of generating spin torque electrons in the top reference layer 244, which starts the process of switching the magnetization direction 226 of the low moment third region 216.

At t=5.0 ns, the write pulse 450 continues the process of changing the magnetization direction 222 of the low moment first region 210, as well as the magnetization direction 226 of the low moment third region 216. The magnitude of the write pulse 450 need not be sufficient to switch magnetization direction 224 of the high $E_b$ second region 212, because, by t=5.0 ns, the magnetization direction 222 of the low moment first region 210 has begun to influence the magnetization direction 224 of the high $E_b$ second region 212 through magnetic exchange coupling provided by the first nonmagnetic exchange coupling region 214. Similarly, by t=5.0 ns, the magnetization direction 226 of the low moment third region 210 has begun to influence the magnetization direction 224 of the high $E_b$ second region 212 through magnetic exchange coupling provided by the second nonmagnetic exchange coupling region 218. Because the low moment regions 210, 216 are magnetically coupled to the high $E_b$ second region 212, as the low moment region magnetization directions 222, 226 are switched, the low moment regions 210, 216 drag the high $E_b$ region's magnetization direction 224 to switch along with them. Accordingly, the low moment first region's magnetization direction 222 is switched by the write current 450, the low moment third region's magnetization direction 226 is switched by the write current 450, and the high $E_b$ region's magnetization direction 224 is switched by the influence of magnetic exchange coupling between the high $E_b$ region 212 and both the low moment first region 210 and the low moment third region 216. The novel double-tunnel-junction and magnetic exchange coupled free layer 208A of the MTJ 102B has both low overdrive and high $E_b$. Low overdrive is determined by the low moment regions 210, 216 at the interfaces with the tunnel barriers 206, 246, and high $E_b$ largely comes from the high $E_b$ second region 212. By tuning the parameters (e.g., thickness, material, etc.) of the nonmagnetic exchange coupling region 214 to optimize the magnetic exchange coupling strength, and by positioning the nonmagnetic exchange coupling region 214 between the low moment first region 210 and the high $E_b$ second region 212 of the composite free layer 208A, an optimum switching efficiency ($E_b/I_c$ at 10 ns) can be achieved. By t=10.0 ns, the novel process of switching the composite free layer's magnetization directions 222, 224, 226 has completed.

FIG. 4C also depicts a sequence of four diagrams along the bottom of FIG. 4C, where each diagram illustrates the magnetization directions 220, 222, 224, 226, 250 of the MTJ 102B at a particular time (t) and with an upward current direction (e-) during application of a negative version of the write pulse 450 shown in FIG. 4A. The switching operation depicted by the sequence of four diagrams along the bottom of FIG. 4C proceeds in substantially the same manner as the switching operation depicted by the sequence of four diagrams along the top of FIG. 4C, except the current direction is upward, and the composite free layer magnetization directions 222, 224, 226 are switched from pointing downward to pointing upward.

The various layers and regions that form the MTJs 102A, 102B can be formed, for example, by any suitable deposition, growth or other formation process. The reference layers 204, 244 can be formed of ferromagnetic material, including, but not limited to, Co containing multilayers for example CoIPt, CoINi, CoIPd, CoIIr, CoIRh etc, alloys with perpendicular anisotropy for example CoPt, FePt, CoCrPt etc and rare earth-transition metals, for example CoFeTb etc. In accordance with embodiments of the invention, the reference layers 204, 244 are formed and configured in a manner that provides the fixed magnetization directions 220, 250.

The tunnel barrier layers 206, 246 can be a non-conductive material, including, but not limited to, MgO, AlOx, MgAlOx, CaOx etc. In accordance with embodiments of the invention, the tunnel barriers 206, 246 are configured to be thin enough to allow electrons (specifically, spin torque electrons) from the reference layers 204, 244, respectively, to quantum mechanically tunnel through the tunnel barriers 206, 246. The tunnel barriers 206, 246 are also configured to be thick enough to decouple the composite free layer 208, 208A from the reference layers 204, 244 such that the magnetization directions 222, 224, or 226 of the composite free layers 208, 208A, respectively, are free to flip back and forth.

The composite free layer 208 can include a low moment first region 210, a high $E_b$ second region 212 and a nonmagnetic exchange coupling region 214 positioned between the first region 210 and the second region 212. The composite free layer 208A can include a low moment first region 210, a high $E_b$ second region 212, a low moment third region, a first nonmagnetic exchange coupling region 214 positioned between the first region 210 and the second region 212, and a second nonmagnetic exchange coupling region 218 positioned between the second region 212 and the third region 216. The low moment regions 210, 216 can be Co, Fe, Ni, and B based materials with or without light element doping. As used herein, the phrase "light element doping" refers to a doping level of about one to about ten dopant atoms per about 100 atoms of the host material. Examples dopants include, but are not limited to, Al, Mg, Ti, Sc, Ca, V, Cr, Mn, Ge, Si, C, Be and Ga. The thickness of the low moment regions 210, 216 can range from about 8 angstroms to about 20 angstroms. The high $E_b$ second region 212 can be Co, Fe, Ni and B based materials; Co/Pd, Co/Ir, Co/Pt, Co(Fe)/Tb, Co(Fe)/Gd, Co/Rh multilayers; or CoPt, CoPd, FePt, FePd, CoFeTb, CoFeGd alloys. The thickness of the high $E_b$ second region 212 can range from about 10 angstroms to about 100 angstroms. The exchange coupling regions 214, 218 can each be a metal, including, for example, Ta, W, Ir, Mo and its alloys with Fe, Co or Ni. The exchange coupling regions 214, 218 can also each be an oxide, including, for example, MgO, AlOx, TiOx, TaOx, WOx or mixtures thereof. The thickness of the exchange coupling regions 214, 218 can each range from about 1 angstroms to about 10 angstroms. In accordance with embodiments of the invention, the regions 210, 212, 216 of the composite free layers 208, 208A, respectively, are formed and configured in a manner that provide the switchable magnetization directions 222, 224, 226.

The regions 210, 216 can be formed from a low moment magnetic metal having low moment properties. A magnetic material can be considered "low moment" if its $M_s t$ product is ≤ about 0.12 emu/cm², where $M_s$ is the material's saturation magnetization, t is the material's thickness, and emu is a cgs (centimetre-gram-second) unit for measuring magnetic moment.

The region 212 can be formed from a high $E_b$ magnetic metal. A magnetic metal can be considered to have a high $E_b$ if its $E_b$ is sufficient to satisfy the data retention requirement for targeted application. This translates to an activation energy (or energy barrier) $E_b$ that is within the range from about 60 to about 100 kT (k=the Boltzmann constant, and T=temperature) for approximately 10 year data retention.

The thicknesses of the respective layers of the novel MTJ storage elements described herein can vary according to design considerations. For example, the thicknesses of the layers of the novel MTJ storage element can be designed to have predetermined thicknesses, to have thicknesses within predetermined ranges, to have thicknesses having fixed ratios with respect to each other, or to have thicknesses based on any other consideration or combination of considerations in accordance with the various functionalities described herein.

Thus it can be seen from the foregoing detailed description that the present invention provides STT-MTJ storage elements having a double-tunnel-junction and magnetic exchange coupled composite free layer configured to minimize the magnitude of a fast switching current (e.g., a write pulse width 10 ns) while providing high data retention (e.g., ≥10 years). The a double-tunnel-junction and magnetic exchange coupled composite free layer MTJ will have higher activation energy due to the composite free layer, but lower switching current due to spin torque being applied to both sides of the composite free layer. The low moment free layers of the composite free layer structure can be made thinner and easier to switch (lower perpendicular magnetic anisotropy) than the high $E_b$ free layer of the composite free layer structure. Each of the free magnetic layers has thickness in the range 1-10 nm and the spacer layer is typically less than 1 nm thick. Any one or more of the magnetic layers (including free and/or reference layers) can be replaced by a synthetic antiferromagnet, which itself is composed of two magnetic layers separated by a thin metallic spacer (typically Ru, Os, Ir, Rh, Re, or their alloys), which couples the two magnetic layers tightly in an anti-parallel manner.

The terms "example" or "exemplary" are used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, where intervening elements such as an interface structure can be present between the first element and the second element. The phrase "direct contact" means that a first element, such as a first structure, and a second element, such as a second structure, are connected without any intermediary conducting, insulating or semiconductor layers at the interface of the two elements. It should be noted that the phrase "selective to," such as, for example, "a first element selective to a second element," means that a first element can be etched and the second element can act as an etch stop. The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof. For example, a composition, a mixture, process, method, article, or apparatus that comprises a list of elements is not necessarily limited to only those elements but can include other elements not expressly listed or inherent to such composition, mixture, process, method, article, or apparatus.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated While a preferred embodiment has been described, it will be understood that those skilled in the art, both now and in the future, can make various improvements and enhancements which fall within the scope of the claims which follow.

What is claimed is:

1. A method of forming a magnetic tunnel junction (MTJ) storage element, the method comprising:
    forming a first reference layer having a first fixed magnetization direction;
    forming a first tunnel barrier layer;
    forming a composite free layer on an opposite side of the first tunnel barrier layer from the first reference layer;
    forming a second tunnel barrier on an opposite side of the free layer from the first tunnel barrier; and
    forming a second reference layer having a second fixed magnetization direction, where the second reference layer is on an opposite side of the second tunnel barrier from the free layer;
    where forming the composite free layer comprises:
        forming a first region comprising a first material configured to include a first predetermined magnetic moment and a first switchable magnetization direction;
        forming a second region comprising a second material configured to include a second predetermined magnetic moment and a second switchable magnetization direction;
        forming a first spacer material between the first region and the second region; and
        configuring the first spacer material to provide magnetic exchange coupling between the first region and the second region;
    where the first predetermined magnetic moment is configured to be lower than the second predetermined magnetic moment;
    where the first region, the second region and the first spacer material are configured such that a direction of the first switchable magnetization direction changing also initiates the change in the direction of the second switchable magnetization direction.

2. A method of forming a magnetic tunnel junction (MTJ) storage element, the method comprising:
    forming a first reference layer having a first fixed magnetization direction;
    forming a first tunnel barrier layer;
    forming a composite free layer on an opposite side of the first tunnel barrier layer from the first reference layer;
    forming a second tunnel barrier on an opposite side of the free layer from the first tunnel barrier; and
    forming a second reference layer having a second fixed magnetization direction, where the second reference layer is on an opposite side of the second tunnel barrier from the free layer;
    where forming the composite free layer comprises:
        forming a first region comprising a first material configured to include a first predetermined magnetic moment and a first switchable magnetization direction;
        forming a second region comprising a second material configured to include a second predetermined magnetic moment and a second switchable magnetization direction;
        forming a third region comprising a third material configured to include a third predetermined magnetic moment and a third switchable magnetization direction;
        forming a first spacer material between the first region and the second region, where the first spacer material is configured to provide magnetic exchange coupling between the first region and the second region; and
        forming a second spacer material between the second region and the third region, where the second spacer material is configured to provide magnetic exchange coupling between the second region and the third region;
    where the first predetermined magnetic moment is configured to be lower than the second predetermined magnetic moment;
    where the third predetermined magnetic moment is configured to be lower than the second predetermined magnetic moment;
    where the first region, the second region, and the first spacer material are configured such that a direction of the first switchable magnetization direction changing causes a direction of the second switchable magnetization direction to change;

where the third region, the second region, and the second spacer material are configured such that a direction of the third switchable magnetization direction changing causes the direction of the second switchable magnetization direction to change.

3. A method of operating a magnetic tunnel junction (MTJ) storage element, the method comprising:
applying a write pulse having a predetermined magnitude to the MTJ storage element;
where the MTJ storage element comprises:
  a first reference layer having a first fixed magnetization direction;
  a first tunnel barrier layer;
  a free layer on an opposite side of the first tunnel barrier layer from the first reference layer;
  a second tunnel barrier on an opposite side of the free layer from the first tunnel barrier; and
  a second reference layer having a second fixed magnetization direction, where the second reference layer is on an opposite side of the second tunnel barrier from the free layer;
where the free layer comprises:
  a first region comprising a first material configured to include a first predetermined magnetic moment and a first switchable magnetization direction;
  a second region comprising a second material configured to include a second predetermined magnetic moment and a second switchable magnetization direction; and
  a third region comprising a third material configured to include a third predetermined magnetic moment and a third switchable magnetization direction;
  a first spacer material between the first region and the second region, where the first spacer material is configured to provide magnetic exchange coupling between the first region and the second region;
  a second spacer material between the third region and the second region, where the second spacer material is configured to provide magnetic exchange coupling between the second region and the third region;
where the first predetermined magnetic moment is configured to be lower than the second predetermined magnetic moment;
  where the third predetermined magnetic moment is configured to be lower than the second predetermined magnetic moment; and where the first region, the second region and the first spacer material are configured such that a direction of the first switchable magnetization direction changing also initiates the change in the direction of the second switchable magnetization direction to change; and
where the third region, the second region, and the second spacer material are configured such that a direction of the third switchable magnetization direction changing causes the direction of the second switchable magnetization direction to change.

4. The method of claim 3 further comprising:
based at least in part on receiving the write pulse, generating spin torque electrons in the first reference layer material, where the spin torque electrons generated in the first reference layer material are insufficient to initiate a process of switching the second switchable magnetization direction of the second region; and
based at least in part on spin torque electrons being generated in the first reference layer material, initiating a process of switching the first switchable magnetization direction of the first region;
where the first switchable magnetization direction of the first region switching assists the process of switching the second switchable magnetization direction of the second region based at least in part on the magnetic exchange coupling between the first region and the second region provided by the first spacer material; and
based at least in part on receiving the write pulse, generating spin torque electrons in the second reference layer material, where the spin torque electrons generated in the second reference layer material are insufficient to initiate a process of switching the second switchable magnetization direction of the second region; and
based at least in part on spin torque electrons being generated in the second reference layer material, initiating a process of switching the third switchable magnetization direction of the third region;
where the third switchable magnetization direction of the third region switching assists the process of switching the second switchable magnetization direction of the second region based at least in part on the magnetic exchange coupling between the third region and the second region provided by the second spacer material.

* * * * *